US 6,700,306 B2

(12) United States Patent
Nakamura et al.

(10) Patent No.: US 6,700,306 B2
(45) Date of Patent: Mar. 2, 2004

(54) LAMINATED PIEZO-ELECTRIC DEVICE (75) Inventors: Shigenobu Nakamura, Kokubu (JP); Koki Ashida, Kokubu (JP)

(73) Assignee: Kyocera Corporation, Kyoto (JP)

( * ) Notice: Subject to any disclaimer, the term of this patent is extended or adjusted under 35 U.S.C. 154(b) by 123 days.

(21) Appl. No.: 10/083,635

(22) Filed: Feb. 25, 2002

(65) Prior Publication Data
US 2002/0158552 A1 Oct. 31, 2002

(30) Foreign Application Priority Data

| Feb. 27, 2001 | (JP) | ......... 2001-52410 |
| Mar. 30, 2001 | (JP) | ......... 2001-100381 |

(51) Int. Cl.$^7$ .......................................... H01L 41/083
(52) U.S. Cl. ...................................... 310/328; 310/366
(58) Field of Search ................................. 310/328, 366

(56) References Cited

U.S. PATENT DOCUMENTS

| 4,011,474 | A | * | 3/1977 | O'Neill | ................ 310/328 |
| 4,845,399 | A | * | 7/1989 | Yasuda et al. | ........... 310/328 |
| 5,254,212 | A | * | 10/1993 | Someji et al. | ............ 216/20 |
| 5,459,371 | A | * | 10/1995 | Okawa et al. | ........... 310/328 |
| 6,104,129 | A | * | 8/2000 | Okamoto | ................ 310/366 |

FOREIGN PATENT DOCUMENTS

| JP | 3-155176 | * | 11/1989 | ............ H01L/41/09 |
| JP | 4-76968 | * | 3/1992 | ............ H01L/41/09 |
| WO | WO-92/06511 | * | 4/1992 | ............ H01L/41/08 |

* cited by examiner

Primary Examiner—Thomas M. Dougherty
(74) Attorney, Agent, or Firm—Hogan & Hartson (57) ABSTRACT

A laminated piezo-electric device comprising a pole-like laminate formed by alternately laminating piezo-electric layers and electrode layers in the direction of height, and a pair of outer electrode plates formed on the different side surfaces of said pole-like laminate, said two electrode layers neighboring each other with said the piezo-electric layer sandwiched therebetween being electrically connected at their side surfaces to the outer electrode plates which are different from each other, wherein flexible protruded electrically conducting terminals are provided on the side surfaces of said pole-like laminate on where the outer electrodes are arranged, said flexible protruded electrically conducting terminals extending along the side surfaces of the electrode layers and are capable of following the stretching and contraction of said pole-like laminate in the direction of height thereof, and the electrode layers being joined to said outer electrode plates via said protruded electrically conducting terminals. In this laminated piezo-electric device, the protruded electrically conducting terminals absorb the stress produced by the stretching and contraction of the pole-like laminate, and features excellent durability without causing the wires to be broken between the outer electrodes and the inner electrodes even when the piezo-electric device is continuously driven at a high electric field under a high pressure for extended periods of time.

11 Claims, 7 Drawing Sheets

Fig. 10 PRIOR ART

LAMINATED PIEZO-ELECTRIC DEVICE

BACKGROUND OF THE INVENTION

1. Field of the Invention

The present invention relates to a laminated piezo-electric device. More specifically, the invention relates to a laminated piezo-electric device that can be particularly desirably used for the fuel injection devices for automobiles, for the positioning devices used for precision equipment such as optical devices, and as a drive device for preventing vibration.

2. Description of the Related Art

Laminated piezo-electric devices are provided with a pole-like laminate formed by alternately laminating piezoelectric layers and electrode layers (inner electrodes), and can be classified into two types, i.e., those of the co-fired type and those of the stacked type. From the standpoint of lowering the voltage, lowering the cost of production and decreasing the thickness of the layers, the laminated piezoelectric device of the co-fired type is advantageous and is finding gradually spreading applications.

Figure 10:
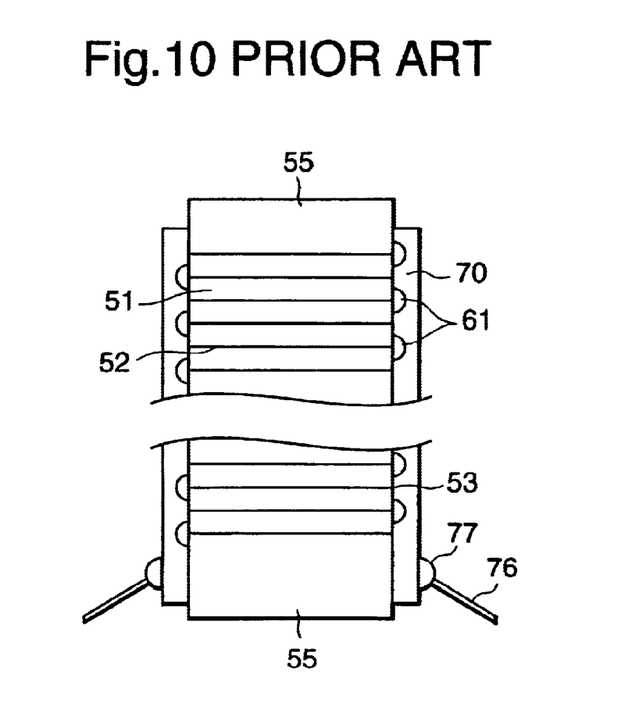
FIG. 10 is a side sectional view illustrating a conventional laminated piezo-electric device.

FIG. 10 is a diagram schematically illustrating the structure of a conventional laminated piezo-electric device having a pole-like laminate 53 formed by alternately laminating piezo-electric layers 51 and internal electrode layers 52 in the direction of height. Inert ceramic layers 55 and 55 are laminated on the upper end and on the lower end of the pole-like laminate 53. The inner electrode layer 52 is covered at its one end (side surface) with an insulator 61. As is obvious from FIG. 10, the two inner electrode layers 52 and 52 neighboring each other with the piezo-electric layer 51 sandwiched therebetween have their different ends (side surfaces) covered with the insulators 61. For example, the inner electrode layer 52 laminated on the upper surface of the piezo-electric layer 51 has its right side surface covered with the insulator 61, whereas the inner electrode layer 52 laminated on the lower surface of the piezo-electric layer 51 has its left side surface covered with the insulator 61.

Thus, the insulators 61 are provided on the different side surfaces of the pole-like laminate 53 so as to cover the side surfaces of the inner electrode layers 52 in an alternate manner. As shown in FIG. 10, further, belt-like outer electrodes 70 and 70 are formed on the side surfaces, and lead wires 76 are attached by a solder 77 to the belt-like outer electrodes 70 (one of the belt-like outer electrodes 70, 70 is a positive electrode, and the other one is a negative electrode).

Therefore, the inner electrode layers 52 are connected to the belt-like outer electrode 70 at their side surfaces that have not been covered with the insulators 61. Each of the belt-like outer electrodes 70 and 70 is conductive to every other inner electrode layer 52. Among the inner electrode layers 52, 52 which are neighbored with each other, one of the inner electrode layers 52, 52 is conductive to the belt-like outer electrode 70 of the positive polarity and another of the inner electrode layers 52, 52 is conductive to the belt-like outer electrode 70 of the negative polarity.

Concerning the laminated piezo-electric device having the above-mentioned structure, Japanese Unexamined Patent Publication (Kokai) No. 237172/1992 discloses the one wherein every other end (side surface) of the inner electrode layer exposed to the side surface of the pole-like laminate is covered with a glass (insulator) layer, and the inner electrode layer 52 and the neighboring upper and lower piezo-electric layers (51) are firmly joined together with the glass layer, the glass layer being held in a recessed portion of the outer electrode 70.

In recent years, however, it is a trend to apply a higher electric field and to continuously drive the device for extended periods of time in order to obtain a large amount of displacement under a large pressure by using a small piezoelectric device.

When the above-mentioned conventional laminated piezo-electric device is continuously driven for extended periods of time under the conditions of a high electric field and a large pressure, however, the inner electrode layers 52 formed among the piezo-electric layers 51 peel off the outer electrodes 70 of the positive polarity and of the negative polarity, whereby no voltage is supplied to some of the piezo-electric layers 51 causing a change in the displacement characteristics during the operation. Even the piezoelectric device disclosed in the above-mentioned prior art permits the glass layer (insulating layer) to be cracked when it is continuously driven for extended periods of time under the conditions of a high electric field and a large pressure. Due to the cracking, a short-circuit occurs between the inner electrode layers and the outer electrodes, whereby the voltage is not applied to some of the piezo-electric layers still causing a change in the displacement characteristics during the operation.

That is, the pole-like laminate which is the main body of the laminated piezo-electric device undergoes the stretching and contraction in a direction in which the piezo-electric layers and the inner electrode layers are laminated (in the direction of height). Therefore, the glass layer of a high Young's modulus covering the ends of the inner electrode layers (also covering the ends of the piezo-electric layers neighboring the inner electrode layers) becomes no longer capable of withstanding the stretching/contraction operation due to the continuous drive for extended periods of time and is destroyed, and a short-circuit occurs between the inner electrode layers and the outer electrodes via the destroyed portions.

Japanese Unexamined Patent Publications (Kokai) Nos. 283451/1995 and 51240/1996 disclose laminated piezoelectric devices having electrically conducting protuberances formed by plating on the ends (side surfaces) of the inner electrode layers 52. With the above piezo-electric devices, however, the junction strength is weak between the electrically conducting protuberances and the pole-like laminate, and the ends of the inner electrode layers peel off the electrically conducting protuberances while the piezoelectric device is in operation. Accordingly, no voltage is supplied to some of the piezo-electric layers like in the above-mentioned case still unable to avoid the problem in that the displacement characteristics undergo a change while the piezo-electric device is in operation.

SUMMARY OF THE INVENTION

It is therefore an object of the present invention to provide a laminated piezo-electric device which maintains stable displacement characteristics and excellent durability without permitting the wires to be broken between the outer electrodes and the inner electrodes even after continuously driven for extended periods of time under the conditions of a high electric field and a large pressure.

Another object of the present invention is to provide an injection device by using the above laminated piezo-electric device.

According to the present invention, there is provided a laminated piezo-electric device comprising a pole-like laminate formed by alternately laminating the piezo-electric layers and the inner electrode layers in the direction of height, and a pair of outer electrode plates formed on the different side surfaces of the pole-like laminate, the two inner electrode layers neighboring each other with the piezo-electric layer sandwiched therebetween being electrically connected at their side surfaces to the outer electrode plates which are different from each other, wherein flexible protruded electrically conducting terminals are provided on the side surfaces of the pole-like laminate on where the outer electrodes are arranged, the flexible protruded electrically conducting terminals extending along the side surfaces of the inner electrode layers and being capable of following the stretching and contraction of the pole-like laminate in the direction of height thereof, and the inner electrode layers are joined to the outer electrode plates via the protruded electrically conducting terminals.

According to the present invention, there is further provided an injection device comprising a container having an injection aperture, a laminated piezo-electric device of the invention contained in the container, and a valve for injecting a liquid through the injection aperture being driven by the laminated piezo-electric device.

In the laminated piezo-electric device of the present invention, protruded electrically conducting terminals are provided on the side surfaces on one side of the inner electrode layers (i.e., at portions on the side surfaces of the pole-like laminate), and the inner electrode layers are connected to the outer electrode plate of the positive polarity or to the outer electrode plate of the negative polarity through the protruded electrically conducting terminals. That is, the protruded electrically conducting terminals used in the present invention are flexible to follow the stretching and contraction of the pole-like laminate in the direction of height (in the direction in which the piezo-electric layers and the inner electrode layers are laminated). Therefore, when the piezo-electric device is driven causing the pole-like laminate to undergo the stretching and contraction in the direction of height, stress due to the stretching and contraction is absorbed by the protruded electrically conducting terminals that undergo the deformation. This effectively suppresses the breakage of the electric wires between the outer electrode plates and the inner electrode layers even when the piezo-electric device is continuously operated for extended periods of time under the conditions of a high electric field and a large pressure, avoids a change in the displacement characteristics, and makes it possible to greatly enhance the durability.

Therefore, the injection device which employs the laminated piezo-electric device of the above-mentioned structure operates to stably inject the fuel for extended periods of time.

In the present invention, further, the protruded electrically conducting terminals are formed by applying an electrically conducting paste containing an electrically conducting metal powder and a glass powder onto the side surfaces of the inner electrode layers that are to be connected to the outer electrode plates and onto the side surfaces of the piezo-electric layers positioned in the vicinities thereof, and heating and firing the electrically conducting paste. That is, the glass powder is softened at the time of firing and, in this state, the metal powder that little diffuses into the piezo-electric layers is collected on the side surfaces of the inner electrode layers thereby to form protruded electrically conducting terminals that extend along the side surfaces of the inner electrode layers. Besides, the thus formed protruded electrically conducting terminals are buried at their root portions in the glass layer and are firmly secured. Accordingly, the protruded electrically conducting terminals and the inner electrode layers are firmly joined together, and the protruded electrically conducting terminals are effectively prevented from being peeled off by the movement of the piezo-electric device (by the stretching and contraction of the pole-like laminate).

In the present invention, further, an electrically conducting member for preventing local heating can be provided on the outer surfaces of the outer electrode plates electrically connected to the inner electrode layers via the protruded electrically conducting terminals. The electrically conducting member may be an electrically conducting coil, an electrically conducting corrugated plate, an aggregate of electrically conducting fibers or an electrically conducting sheet formed of an electrically conducting adhesive resin composition. Upon operating the piezo-electric device by supplying a current to the outer electrode plates through such electrically conducting members, it is allowed to prevent the outer electrode plates from being locally heated and to prevent the breakage of wires caused by the local heating even when the piezo-electric device is driven at high speeds by supplying a large current.

BRIEF DESCRIPTION OF THE DRAWINGS

FIGS. 1a to 1c are views illustrating a laminated piezo-electric device according to the present invention, wherein

DETAILED DESCRIPTION OF THE INVENTION

Structure of the Laminated Piezo-electric Device

Figure 1A:
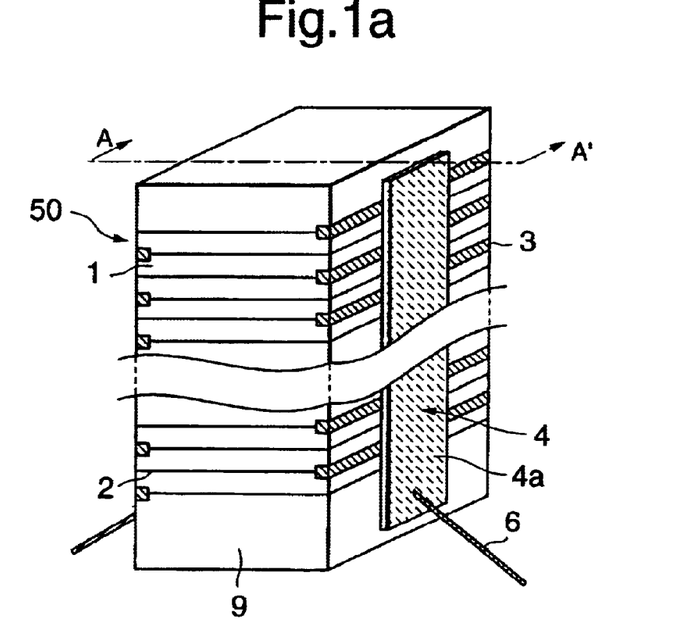
FIG. 1a is a perspective view.
Figure 1B:
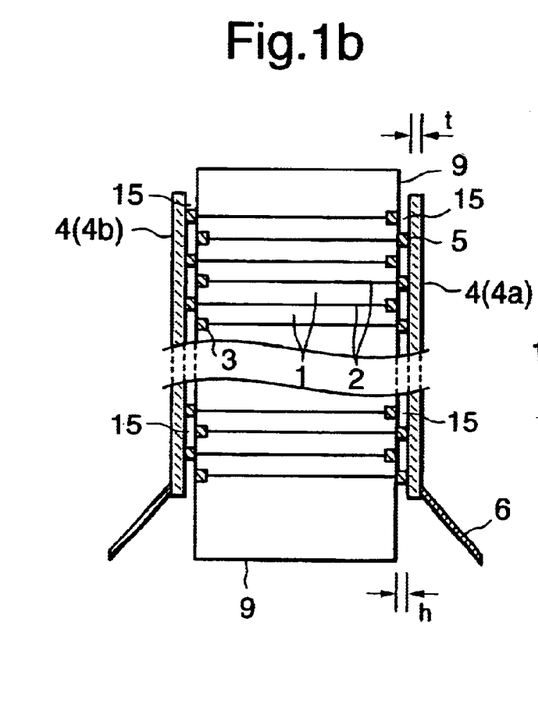
FIG. 1b is a vertical sectional view along the line A–A' in FIG. 1a, and FIG. 1c is a perspective view illustrating a portion of FIG. 1a on an enlarged scale.
Figure 1C:
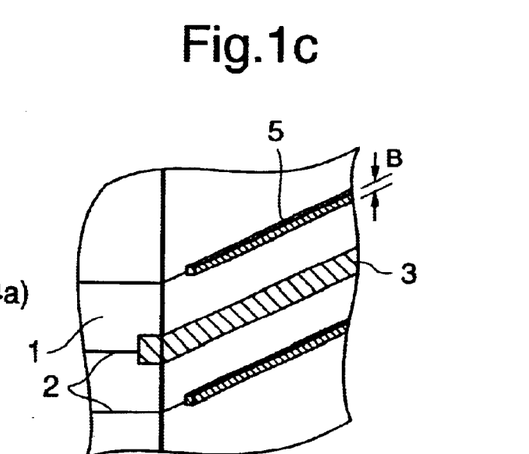

Referring to FIGS. 1a to 1c illustrating a laminated piezo-electric device of the present invention, the piezo-electric device comprises a square pole-like laminate 50 formed by alternately laminating piezo-electric layers 1 and inner electrode layers 2. Inert ceramic layers 9 are provided at the upper end and at the lower end thereof.

The piezo-electric layer 1 is formed of a piezo-electric ceramic material comprising, for example, lead zirconate titanate $Pb(Zr, Ti)O_3$ (hereinafter abbreviated as PZT) or barium titanate $BaTiO_3$. It is desired that the piezo-electric ceramics has a high piezo-electric distortion constant $d_{33}$ that represents piezo-electric characteristics.

It is desired that the piezo-electric layer 1 has a thickness (distance between the inner electrode layers 2) of 50 to 250 μm. That is, the amount of displacement obtained by applying a voltage to the laminated piezo-electric device increases with an increase in the number of the laminated layers.

When the thickness of the piezo-electric layer 1 is too large, however, the pole-like laminate 50 becomes too high making it difficult to realize the laminated piezo-electric device in a small size and in a small height. When the thickness of the piezo-electric layer 1 is too small, on the other hand, the dielectric breakdown easily occurs.

The inner electrode layer 2 between the piezo-electric layers 1 is formed of a good metal conductor such as silver, silver-platinum, silver-palladium, or an alloy thereof, and works to apply a predetermined voltage to the piezo-electric layers 1 so as to produce displacement due to the inverse piezo-electric effect. The thickness of the inner electrode layer 1 is usually in a range of from about 1 to about 40 $\mu$m.

The inert ceramic layer 9 is, usually, formed of the same piezo-electric ceramic as the piezo-electric layer 1. That is, this layer 9 is sandwiched by no electrode layer, and is inert.

The pole-like laminate 50 is obtained by alternately laminating the piezo-electric layer 1 and the inner electrode layer 2 in a manner as described below.

First, a slurry is prepared by mixing a calcined powder of piezo-electric ceramics such as PZT, an organic high-molecular binder of the type of acrylic resin or butyral, and a plasticizer such as DBP (dioctyl phthalate) or DOP (dibutyl phthalate). By using this slurry, there is prepared a ceramic green sheet for obtaining the piezo-electric layer 1 based on a known tape-molding method (e.g., doctor blade method or calender roll method).

Next, the binder and the plasticizer are added and mixed into a metal powder or an alloy powder (for example, silver-palladium powder) to prepare an electrically conducting paste which is, then, printed onto the upper surface of the green sheet prepared above maintaining a thickness of 1 to 40 $\mu$m relying upon a screen printing method.

The green sheets on which the electrically conducting paste is printed are laminated in a plurality of pieces one upon another. After having removed the binder at a predetermined temperature, the laminate is fired at 900 to 1200° C. to obtain the above-mentioned pole-like laminate 50.

Outer electrode plates 4 are provided on the different side surfaces of the pole-like laminate 50, and lead wires 6 are connected by soldering to the outer electrode plates 4. When the outer electrode plate 4 (4a) provided on one side surface is of the positive polarity, the outer electrode plate 4 (4b) provided on the other side surface is of the negative polarity.

On one side surface of the pole-like laminate 50 provided with the outer electrode plate 4 (4a) in FIG. 1b, the side surface (end) of every other inner electrode layer 2 is covered with the insulator 3, and the side surfaces of the inner electrode layers 2 that are not covered with the insulator 3 are provided with the protruded electrically conducting terminals 5. The inner electrode layers 2 are electrically connected to the outer electrode 4 (4a) through the protruded electrically conducting terminals. The same structure applies even to the other side surface of the pole-like laminate 50 provided with the outer electrode plate 4 (4b). If its one side surface is covered with the insulator 3, then, the inner electrode layer 2 is provided at its other side surface with the protruded electrically conducting terminal 5. Therefore, the two inner electrode layers 2 and 2 neighboring each other up and down with the piezo-electric layer 1 sandwiched therebetween, are electrically connected to the outer electrode plates 4 (4a and 4b) which are different from each other through the protruded electrically conducting terminals 5. That is, if the inner electrode layer 2 laminated on the piezo-electric layer 1 is connected to the outer electrode plate 4a of, for example, the positive polarity, then, the inner electrode layer 2 laminated under the piezo-electric layer 1 is connected to the outer electrode plate 4b of the negative polarity.

As will be understood from the foregoing description, the pole-like laminate 50 has a structure in which the inner electrode layer 2 having a protruded electrically conducting terminal 5 for connection to the outer electrode plate 4a of the positive polarity and an insulator 3 for insulation from outer electrode 4b of the negative polarity as well as the inner electrode layer 2 having a protruded electrically conducting terminal 5 for connection to the outer electrode plate 4b of the negative polarity and an insulator 3 for insulation from the outer electrode 4a of the positive polarity, are alternately laminated one upon the other with the piezo-electric layer 1 sandwiched therebetween. Upon supplying the electric current through the outer electrode plate 4, therefore, the piezo-electric layers 1 neighboring up and down are applied with inverse voltages relative to each other. Therefore, the pole-like laminate 50 stretches and contracts in the direction of height, and a desired displacement is obtained. That is, a DC voltage of 0.1 to 3 kV/mm is applied to a pair of outer electrodes 4a and 4b through lead wires 6 to polarize the pole-like laminate 50, thereby to complete a laminated piezo-electric element as a product. The lead wires 6 are connected to the external voltage supply unit to apply the voltage to the inner electrodes 2 through the lead wires 6 and the outer electrodes 4. Then, the piezo-electric layers 1 undergo a great displacement due to the inverse piezo-electric effect. By utilizing this displacement, the laminated piezo-electric device of the present invention can be applied to, for example, an injection device such as a fuel injection valve for automobiles for injecting fuel into the engine.

The above-mentioned outer electrode plates 4 (4a, 4b) can be formed of an electrically conducting metal such as silver, nickel, copper, gold or aluminum or an alloy thereof and is, particularly preferably, formed of silver from the standpoint of increasing the junction strength to the inner electrode layer 2 and a small Young's modulus. It is further desired that the thickness t of the outer electrode plates 4 is not larger than 50 $\mu$m so as to follow the stretching and contraction of the pole-like laminate 50 when the piezo-electric element is driven and so will not to cause a breakage in the wires between the outer electrodes 4 and the protruded electrically conducting terminals 5 or between the protruded electrically conducting terminals 5 and the inner electrode layers 2.

On the two different side surfaces (side surfaces on where the outer electrode plates 4 are provided) of the pole-like laminate 50, there are alternately provided the insulators 3 and the protruded electrically conducting terminals 5 at portions on the side surfaces (ends) of the inner electrode layers 2.

That is, the inner electrode layer 2 is electrically connected to either the outer electrode plate 4a or 4b via the protruded electrically conducting terminal 5. Upon providing the insulator 3, therefore, the inner electrode layer 2 is reliably and electrically connected to the other outer electrode plate (4a or 4b). As the insulator 3, therefore, there can be used an insulating material having a high electric resistance, such as a glass, an epoxy resin, a polyamide resin, a polyamideimide resin or a silicone rubber. In order to effectively prevent the peeling from the side surfaces of the pole-like laminate 50, in particular, the silicone rubber is preferably used as the material of a low modulus of elasticity that follows the stretching and contraction of the pole-like laminate 50.

The above-mentioned insulators 3 are formed by after-treating the side surfaces of the pole-like laminate 50 provided with the outer electrode plates 4, forming a groove in the side surface of every other inner electrode layer maintaining a depth of 50 to 500 μm and a width of 30 to 200 μm in the direction of lamination, and filling the groove with the above-mentioned insulating material. Thus, the side surface (end) on one side of the inner electrode layer 2 is covered with the insulator 3 to reliably prevent the electric conduction between the inner electrode layer 2 in this portion and the outer electrode plate 4a or 4b.

The protruded electrically conducting terminal 5 provided on the side surface of the inner electrode layer 2 where the insulator 3 is not provided, is for electrically connecting the inner electrode layer 2 to the outer electrode plate 4. As shown in FIG. 1c, the protruded electrically conducting terminal 5 extends like a rail along the side surface of the inner electrode layer 2, and its length is, usually, set to be nearly the same as the width of the outer electrode plate 4. So far as the connection is reliably made to the outer electrode plate 4, however, the length of the protruded electrically conducting terminal 5 may be shorter than the width of the outer electrode plate 4 as a matter of course.

In the present invention, it is important that the protruded electrically conducting terminal 5 has a flexibility so as to follow the stretching and contraction of the pole-like laminate 50. That is, upon electrically connecting the outer electrode plate 4 to the inner electrode layer 2 through the protruded electrically conducting terminal 5 having flexibility, the stress due to the stretching and contraction of the pole-like laminate 50 in the direction of height thereof caused by the operation of the piezo-electric device is absorbed by the protruded electrically conducting terminals that undergo the deformation, effectively preventing the breakage in the wires between the outer electrode plates and the inner electrode layers.

From such a standpoint that the protruded electrically conducting terminals 5 have flexibility for sufficiently absorbing the stress due to the stretching and contraction of the pole-like laminate 50, it is desired that the thickness B of the protruded electrically conducting terminals 5 (width in the direction of height of the pole-like laminate 50, see FIG. 1c) is not smaller than 1 μm but is not larger than one-half the thickness of the piezo-electric layer 1 and, particularly preferably, in a range of from 5 to 25 μm and that the height h thereof (see FIG. 1b) is not smaller than 1/20 of the thickness of the piezo-electric layer 1 and, particularly, in a range of from 15 to 50 μm. When the thickness B is smaller than the above-mentioned range, it becomes difficult to sufficiently absorb the stress produced by the stretching and contraction. When the thickness B is larger than the above-mentioned range, on the other hand, the electric resistance may increase between the outer electrode plate 4 and the inner electrode layer 2. When the height h is smaller than the above-mentioned range, it becomes difficult to sufficiently absorb the stress produced by the stretching and contraction. When the height h is unnecessarily great, the strength may decrease.

The above-mentioned protruded electrically conducting terminals 5 can be formed of a metal or a metal alloy exemplified concerning the above-mentioned outer electrode plates 4, and are desirably formed of silver from the standpoint of increasing the junction strength to the inner electrode layers 2.

The protruded electrically conducting terminals 5 having flexibility can be formed by applying a paste comprising chiefly an electrically conducting metal such as silver or an alloy thereof onto the side surfaces of the inner electrode layers 2 that are to be connected to the outer electrodes 4, followed by firing at 700 to 950° C.

In this case, the paste is desirably the one in which the glass powder is dispersed in addition to the electrically conducting metal powder or the alloy powder thereof. By applying the paste to the side surfaces of the inner electrode layers 2 and to the vicinities thereof followed by firing, the glass is softened at the time of firing, silver that diffuses less into the piezo-electric layer 1 diffuses into the side surfaces of the inner electrode layers 2 and is collected thereby to form the protruded electrically conducting terminals 5 that extend along the side surfaces of the inner electrode layers 2. Besides, the thus formed protruded electrically conducting terminals 5 are buried at their root portions in the glass layer and are very strongly joined to the side surfaces of the inner electrode layers 2. Despite the pole-like laminate 50 undergoes the stretching and contraction, therefore, the wires between the protruded electrically conducting terminals 5 and the inner electrode layers 2 are reliably prevented from being broken.

In forming the protruded electrically conducting terminals 5 by using the glass powder-containing paste as described above, the thickness B and height h of the protruded electrically conducting terminals 5 are controlled to lie within the above-mentioned ranges by adjusting the amount of the glass powder in the paste and by adjusting the amount of application. For example, the electrically conducting metal powder or the alloy powder and the glass powder are used at a volume ratio of 50:50 to 80:20. It is further desired that the glass powder chiefly comprises $SiO_2$ and has a softening point of 700 to 780° C.

Further, the glass powder-containing paste is applied to nearly the whole side surfaces of the pole-like laminate 50 to form the protruded electrically conducting terminals 5, offering an advantage of easy application operation.

Figure 2A:
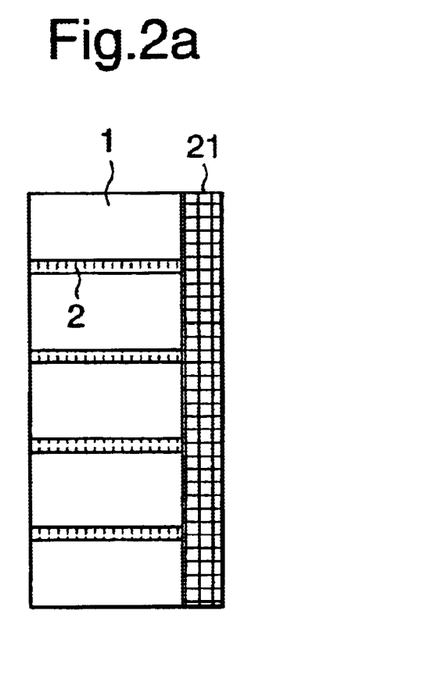
FIGS. 2a to 2c are views illustrating a preferred process for forming protruded electrically conducting terminals on the laminated piezo-electric device of the present invention.
Figure 2B:
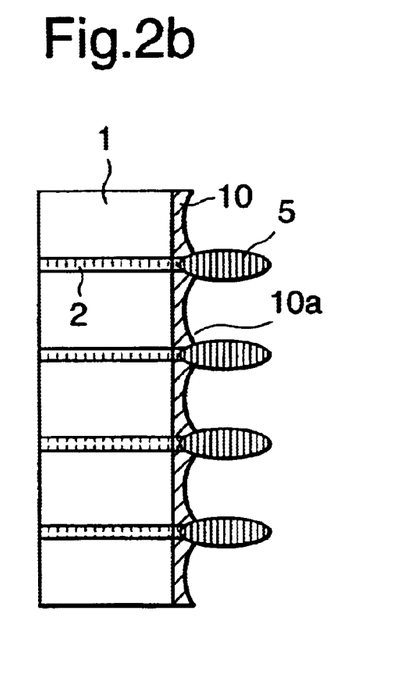
Figure 2C:
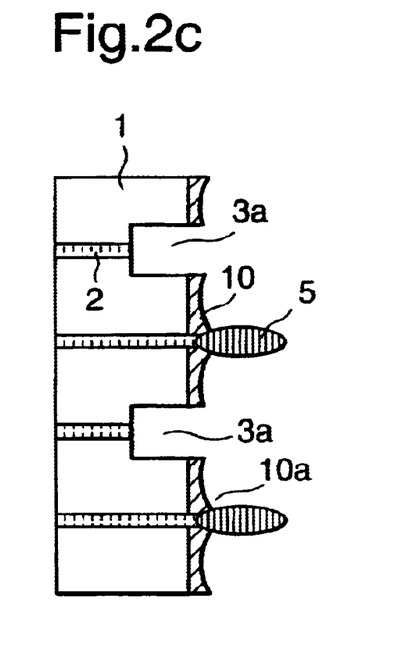

That is, referring to FIGS. 2a to 2c illustrating a process for forming the protruded electrically conducting terminals 5, first, a paste 21 containing the glass powder is applied to the side surfaces (where the outer electrode plates 4 are to be provided) of the pole-like laminate 50 (FIG. 2a).

Then, the paste 21 is fired at a temperature (e.g., not lower than 780° C.) which is not lower than the softening point of the glass powder, whereby the glass in the paste 21 is melted and softened, silver and the like in the paste 21 are collected on the side surfaces of the inner electrode layers 2 and whereby the protruded electrically conducting terminals 5 are formed with their root portions being buried in the glass layer 10 (FIG. 2b). In this state, the protruded electrically conducting terminals 5 are formed on the whole side surfaces of the inner electrode layers 2.

As shown in FIG. 2c, therefore, a groove 3a is formed in the side surface of every other inner electrode layer 2, and is filled with the insulator 3 to form the protruded electrically conducting terminal 5 on the side surface of every other inner electrode layer 2. In this case, the groove 3a may be filled with the insulator 3 after the external electrode plate 4 is mounted.

In forming the protruded electrically conducting terminals 5 in a manner as described above, it is desired that swollen portions 10a of the glass layer 10 is formed on the side surfaces of the inner electrode layers 2 (FIGS. 2b and 2c), and the root portions of the protruded electrically conducting terminals 5 are firmly held by the glass layer 10. To form the swollen portions 10a, it is desired that the electrically conducting metal powder or the alloy powder and the glass powder are used at a volume ratio of 60:40 to 70:30. It is desired that the glass layer 10 has a thickness (except the swollen portions 10a) of from about 2 to about 100 μm and, particularly, from about 5 to about 15 μm.

In the present invention, the outer electrode plates 4 are mounted on the side surfaces of the pole-like laminate 50 on which the protruded electrically conducting terminals 5 have been formed by overlapping the outer electrode plates 4 on the side surfaces of the pole-like laminate 50 so as to come in contact with the protruded electrically conducting terminals 5, and heat-treating them at 700 to 950° C. under the application of a load (usually, 2 to 80 kPa). Then, the electrically conducting components such as silver and the like diffuse into both the protruded electrically conducting terminals 5 and the outer electrode plates 4, whereby the protruded electrically conducting terminals 5 and the outer electrode plates 4 are firmly connected together due to the diffusion and junction of the electrically conducting component.

The thus-formed laminated piezo-electric device of the present invention has the outer electrode plates 4 that are connected to the inner electrode layers 2 through flexible protruded electrically conducting terminals 5. Even when the piezo-electric device is continuously driven in a high electric field under a high pressure for extended periods of time, therefore, stress produced by the stretching and contraction of the pole-like laminate 50 is absorbed by the protruded electrically conducting terminals 5 featuring a very high reliability effectively preventing such problems that the electric wires connecting the outer electrode plates 4 to the inner electrode layers 2 are broken and that a spark occurs between the outer electrode plates 4 and the inner electrode layers 2.

The above-mentioned laminated piezo-electric device of the present invention is not limited to the one having the structure shown in FIGS. 1a to 1c, but can be changed in design in a variety of ways.

As shown in FIGS. 3 to 6, for example, electrically conducting members 7 are provided on the outer surfaces of the outer electrode plates 4, and the electric current is supplied into the inner electrode layers 2 from the outer electrode plates 4 through the electrically conducting members 7. With the electrically conducting members 7 being provided, the electric current flows into the outer electrode plates 4 through the electrically conducting members 7 even when the laminated piezo-electric device is driven at a high speed by supplying a large current thereto. Therefore, a decreased electric current flows into the outer electrode plates 4 effectively preventing the outer electrode plates 4 from being locally heated and preventing the ensuing breakage of the wires, making it possible to greatly improve the durability.

Figure 3:
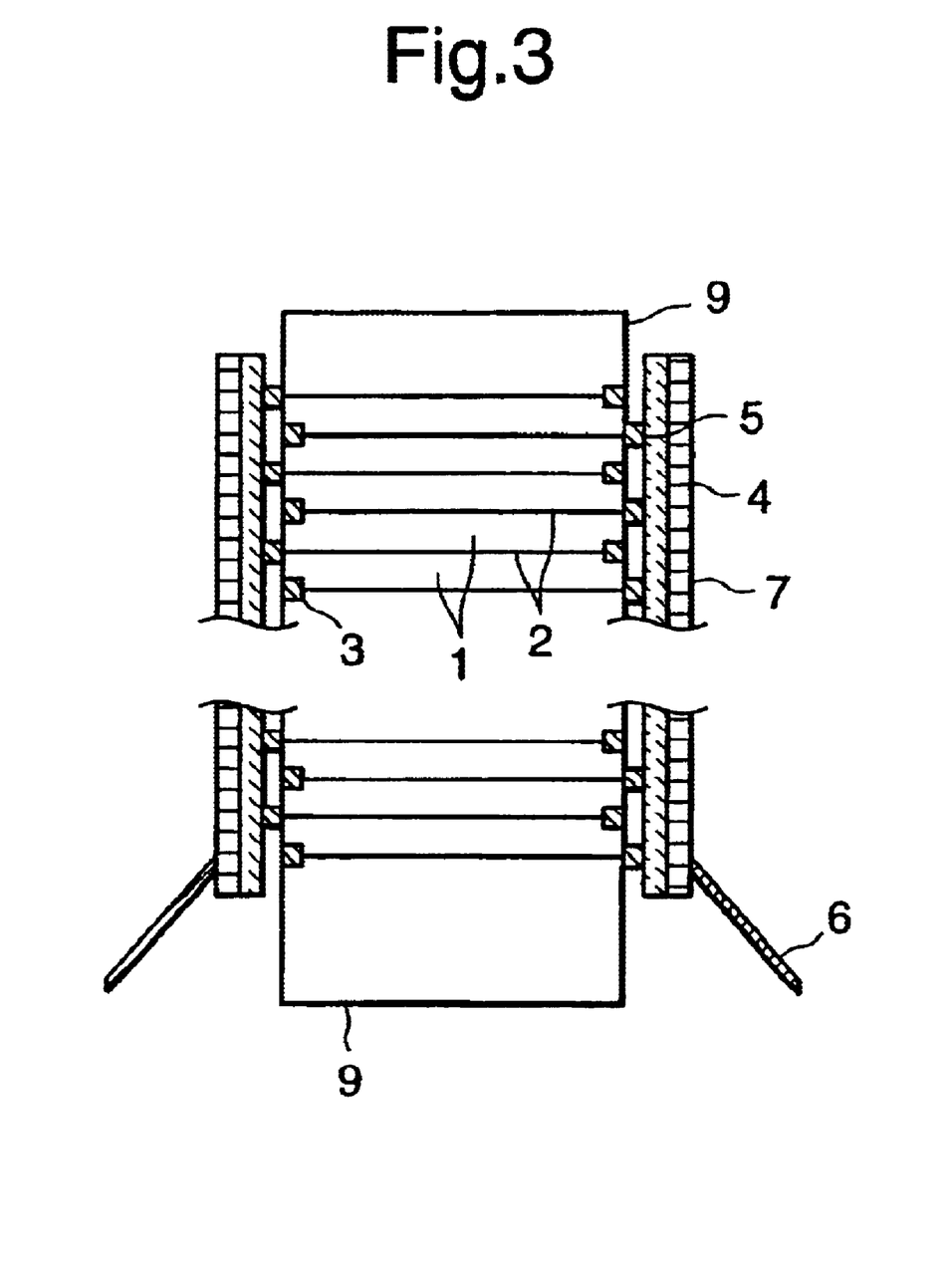
FIGS. 3 to 6 are side sectional views illustrating laminated piezo-electric devices having electrically conducting members formed on the outer surfaces of the outer electrode plates.

In the embodiment shown in FIG. 3, the electrically conducting members 7 are formed of an electrically conducting sheet made of an electrically conducting adhesive resin composition. As the electrically conducting resin composition, there can be preferably used the one obtained by dispersing an electrically conducting agent such as a metal powder or carbon black in a highly heat-resistant polyimide resin from the standpoint of not being deteriorated even when the piezo-electric device is driven at high temperatures. In order to prevent the occurrence of cracks, further, a reinforcing member such as a metallic mesh may be embedded in the electrically conducting sheet. The electrically conducting member 7 comprising the electrically conducting sheet easily follows the stretching and contraction of the pole-like laminate 50, effectively preventing the electrically conducting members 7 from being peeled off the outer electrode plates 4 and preventing the wires from being broken during the operation.

Figure 4:
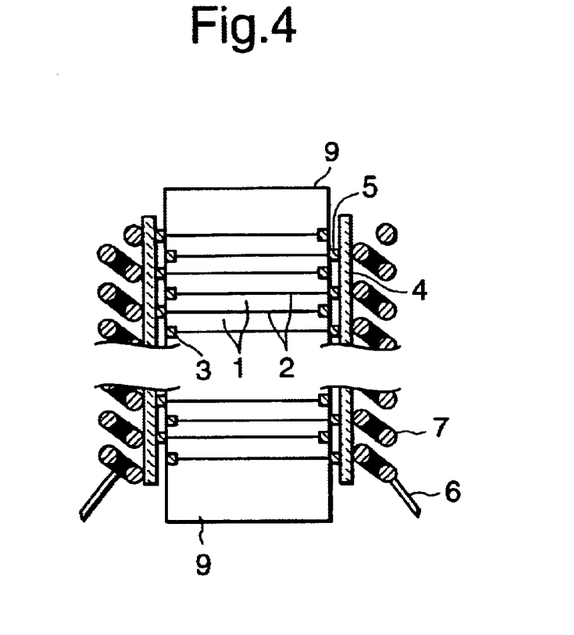
Figure 5:
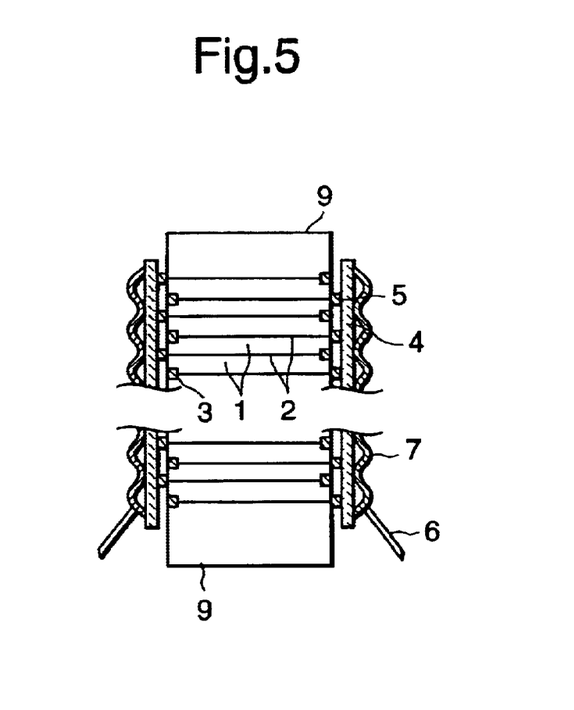
Figure 6:
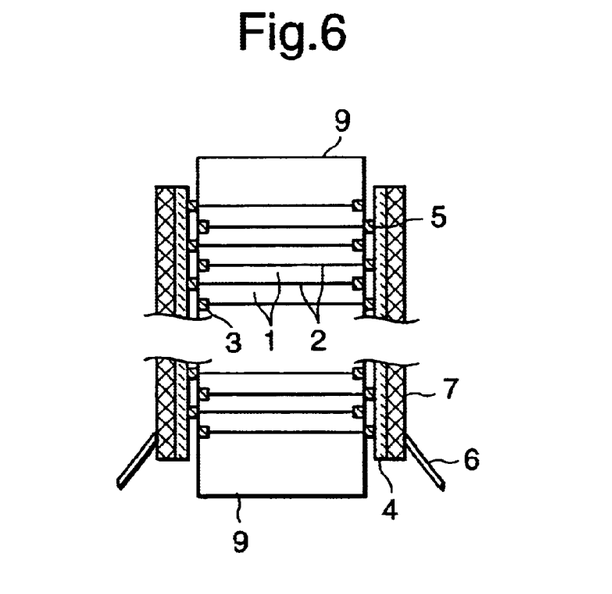

The electrically conducting members 7 are constituted by the electrically conducting coils in FIG. 4, are constituted by the electrically conducting corrugated plates in FIG. 5, and are constituted by the electrically conducting fiber aggregates like that of wool in FIG. 6. In these embodiments, too, the electrically conducting members 7 follow the stretching and contraction of the pole-like laminate 50 to effectively prevent the wires of the electrically conducting members 7 from being broken and the electrically conducting members from being peeled off the outer electrode plates 4 during the operation. In these embodiments, the electrically conducting members 7 can be joined to the outer electrode plates 4 by using a brazing material or an electrically conducting adhesive. In the embodiments of FIGS. 4 to 6, it is most desired that the electrically conducting members 7 are formed of electrically conducting corrugated plates of silver from the standpoint of small resistance, low Young's modulus and small sectional area of the piezo-electric device.

Figure 7:
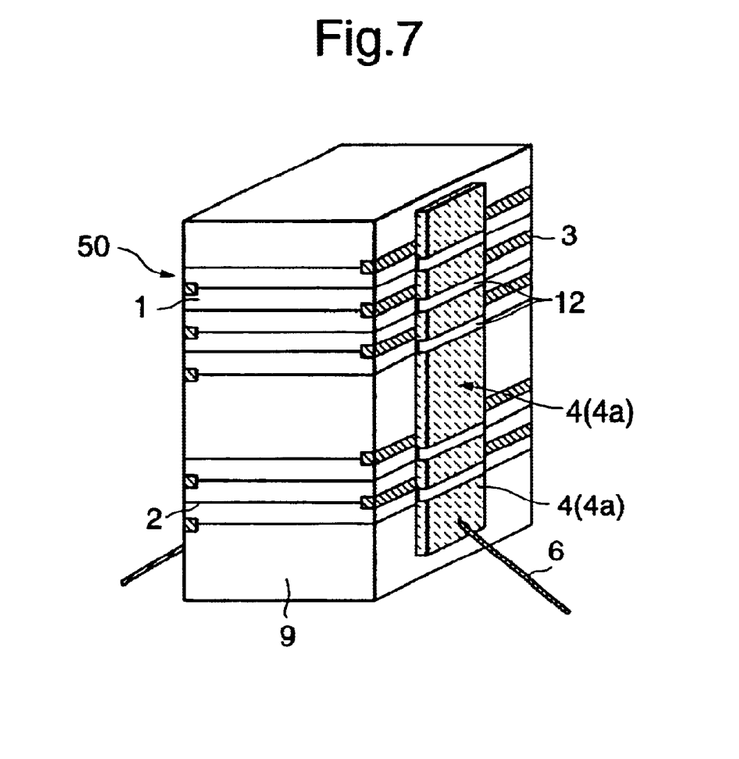
FIGS. 7 and 8 are perspective views of laminated piezo-electric devices in which grooves and slits are formed.
Figure 8:
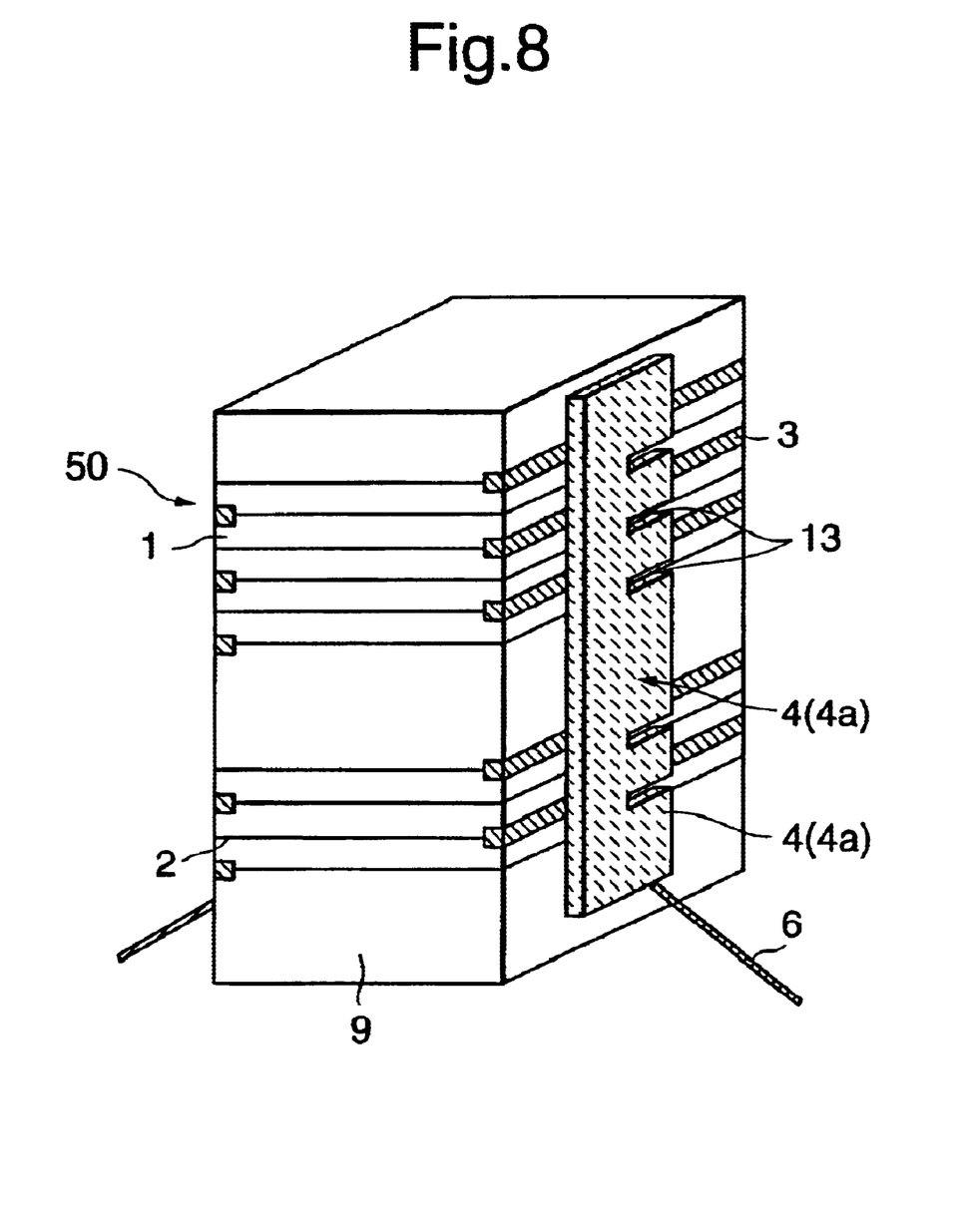

In the laminated piezo-electric device of the present invention as shown in FIGS. 7 and 8, further, the outer electrode plates 4 are provided with recessed portions 12 (FIG. 7) or slits 13 (FIG. 8), and spaces formed between the side surfaces of the pole-like laminate 50 and the outer electrode plates 4 (spaces denoted by 15 in FIG. 1b) are filled with an electrically conducting resin composition. The recessed portion 12 or the slit 13 extends in the transverse direction between the two neighboring protruded electrically conducting terminals 5. The outer electrode plates 4 having such recessed portions 12 or slits 13 formed therein easily undergo the deformation following the stretching or contraction of the pole-like laminate 50 to absorb the stress produced by the stretching or contraction effectively preventing the outer electrode plates 4 from being broken. Even in case the outer electrodes 4 are broken at portions where the recessed portions 12 or the slits 13 are formed, the broken portions are maintained electrically connected by the electrically conducting resin filled in the spaces 15. Therefore, it does not happen that no voltage is applied to the inner electrode layers 2 through the outer electrode plates 4.

In the embodiments of FIGS. 7 and 8, the electrically conducting resin composition filled in the spaces 15 formed between the side surfaces of the pole-like laminate 50 and the outer electrode plates 4 can be the one used for forming the electrically conducting sheet of the electrically conducting members 7. In the embodiment of FIG. 8, it is desired that the slits 13 have a length which is not smaller than two-thirds the width of the outer electrode plates 4 to enable the outer electrode plates 4 to be deformed following the stretching and contraction of the pole-like laminate 50. Depending upon the cases, the outer electrode plates 4 may be completely split by the slits 13.

Injection Device

Even when driven at high speeds and is greatly displaced by supplying a large current under a high pressure, the above-mentioned laminated piezo-electric device of the present invention effectively prevents the breakage of wires between the outer electrode plates 4 and the inner electrode layers 2, and effectively avoids a variation in the amount of displacement, lending itself well for being applied to an injection device such as a fuel injector for automobile engines.

Figure 9:
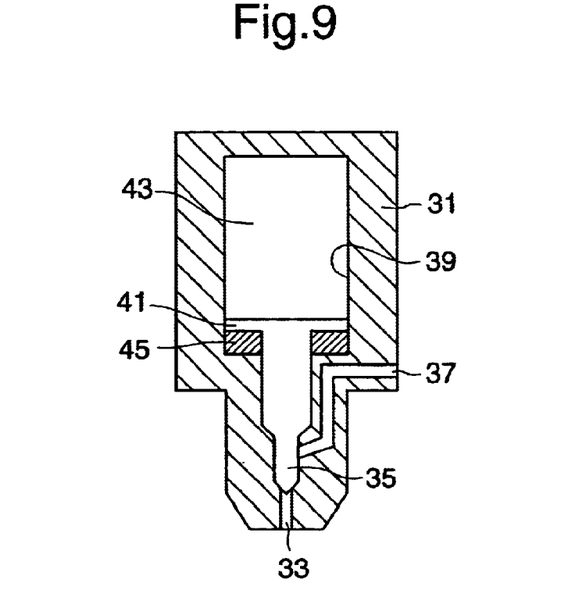
FIG. 9 is a view schematically illustrating the structure of an injection device equipped with a laminated piezo-electric device of the present invention.

FIG. 9 illustrates a structure of such an injection device.

In FIG. 9, the injection device has a container 31 with an injection aperture 33 at an end thereof. The container 31 contains a needle valve 35 capable of opening and closing the injection hole 33.

A fuel passage 37 coupled to an external fuel supply is communicated with the injection aperture 33 through the needle valve 35. The fuel passage 37 is supplied with the fuel maintaining a predetermined high pressure at all times. That is, when the needle valve 35 opens the injection aperture 33, the injection aperture 33 is communicated with the fuel passage 37, and the fuel supplied to the fuel passage 37 is permitted to be injected into a combustion chamber (not shown) of an internal combustion engine under the predetermined high pressure.

In the container 31 is formed a cylinder chamber 39 which contains a piston 41 slidable therein and the above-mentioned laminated piezo-electric device 43. The needle valve 35 has an upper end of a large diameter that is coupled to the piston 41. The piston 41 is urged upward by an initially coned disk spring 45.

In this injection device, when the piezo-electric device 43 stretches due to the application of a voltage, the piston 41 is pushed and slides down, and the needle valve 35 closes the injection aperture 33 to interrupt the supply of fuel. When the application of voltage discontinues, further, the piezo-electric device 43 contracts, the piston 41 slides upward due to the resilient force of the initially coned disc spring 45, and the injection aperture 33 is communicated with the fuel passage 37 to inject the fuel.

EXAMPLES

Experiment 1

An inner electrode layer of a silver-palladium alloy having a thickness of 3 $\mu$m was formed on the surface of a piezo-electric sheet formed of PZT and having a thickness of 150 $\mu$m. 300 Pieces of these sheets were laminated one upon another and were co-fired to produce a pole-like laminate.

A glass paste containing silver was applied onto the side surfaces of the pole-like laminate and was fired at 800° C. to form protruded electrically conducting terminals having a thickness B of 10 $\mu$m and a height h of 20 $\mu$m along the side surfaces of the inner electrode layers exposed to the side surfaces of the pole-like laminate. Then, a groove was formed in side surface of every other inner electrode layer including the protruded electrically conducting terminal.

Thereafter, outer electrode plates of silver having a thickness of 25 $\mu$m were pressed onto the side surfaces of the pole-like laminate with 30 kPa and were heat-treated at 900° C. so as to be adhered to the protruded electrically conducting terminals. Then, the groove was filled with a silicone rubber.

The outer electrode plates were thus provided on the two side surfaces of the pole-like laminate, and a DC electric field of 3 kV/mm was applied to the outer electrode plates of the positive polarity and of the negative polarity through lead wires for 15 minutes to effect the polarization thereby to obtain a laminated piezo-electric device of the structure shown in FIG. 1 (sample No. 1).

A DC voltage of 150 V was applied to the laminated piezo-electric device to obtain a displacement of an amount of 40 $\mu$m in the direction of lamination (direction of height of the pole-like laminate).

Further, an AC voltage of 0 to +150 V having a frequency of 120 Hz was applied to the laminated piezo-electric device at room temperature to conduct the drive testing. The laminated piezo-electric device was driven up to $1 \times 10^8$ cycles producing a displacement of an amount of 40 $\mu$m, and the outer electrode plates developed no abnormal condition. The drive testing was further continued up to $1 \times 10^9$ cycles but still the electrode plates developed no abnormal condition.

The results were as shown in Table 1.

Experiment 2

Laminated piezo-electric devices (samples Nos. 2 to 7) having the structure same as that of Experiment 1 were produced but changing the thickness B and height h of the protruded electrically conducting terminals and changing the thickness t of the outer electrode plates as shown in Table 1.

For comparison, further, a laminated piezo-electric device (sample No. 8) was produced without forming protruded electrically conducting terminals but applying a glass paste in which silver was dispersed onto the side surfaces of the pole-like laminate followed by the heat treatment to form the outer electrode plates.

An AC voltage of 150 V having a frequency of 120 Hz was applied to the above laminated piezo-electric actuators at room temperature to carry out the drive testing in the same manner as in Experiment 1. The amounts of displacement obtained in an initial stage were all 40 $\mu$m (samples Nos. 2 to 8). The results of experiment were as shown in Table 1.

TABLE 1

| Sample No. | Thickness B of protruded terminals | Height h of protruded terminals | Thickness t of outer electrode plates | $1 \times 10^8$ cycles | $1 \times 10^9$ cylces |
|---|---|---|---|---|---|
| 1 | 10 $\mu$m | 20 $\mu$m | 25 $\mu$m | OK | OK |
| 2 | 1 $\mu$m | 7.5 $\mu$m | 25 $\mu$m | OK | OK |
| 3 | 75 $\mu$m | 20 $\mu$m | 25 $\mu$m | OK | OK |
| 4 | 80 $\mu$m | 20 $\mu$m | 25 $\mu$m | OK | dropped to ½ |
| 5 | 10 $\mu$m | 6 $\mu$m | 25 $\mu$m | OK | dropped to ⅔ |
| 6 | 10 $\mu$m | 20 $\mu$m | 50 $\mu$m | OK | OK |
| 7 | 10 $\mu$m | 20 $\mu$m | 60 $\mu$m | OK | dropped to ⅗ |
| *8 | Outer electrodes formed of a silver glass | | | spark on outer electrodes after $1 \times 10^5$ cycles | — |

Samples marked with * lie outside the scope of the invention.

All samples, except the sample No. 8, were driven up to $1 \times 10^8$ cycles producing a displacement of 40 $\mu$m, and the outer electrode plates developed no abnormal condition.

With the sample No. 8, the outer electrode plates made of silver could not follow the stretching and contraction of the pole-like laminate, the wires were broken between the outer electrode plates and the inner electrode layers, and a spark has taken place on the outer electrode plates within short periods of time.

In the case of the samples Nos. 1 to 7 in which the inner electrode layers were joined to the outer electrode plates through the protruded electrically conducting terminals, the protruded electrically conductive terminals were capable of following the stretching and contraction of the pole-like laminates even after they were driven up to $1 \times 10^8$ cycles, and no abnormal condition such as breakage has occurred on the outer electrode plates.

After having further continued the drive testing, it was learned that the samples Nos. 1, 2, 3 and 6 with the protruded electrically conducting terminals of a thickness B of not larger than 75 μm and a height h of not smaller than 7.5 μm and with the outer electrode plates of a thickness t of not larger than 50 μm, all maintained a sufficiently low resistance at the junction portions between the outer electrode plates and the inner electrode layers and were capable of absorbing the stress produced by the stretching and contraction of the pole-like laminate to a sufficient degree, and did not almost permit a decrease in the amount of displacement even after continuously driven at high speeds up to $1 \times 10^9$ cycles, and the outer electrode plates did not develop abnormal condition, either.

Experiment 3

Next, laminated piezo-electric devices (samples Nos. 9 to 12) having the same constitution as that of the sample No. 1 of Experiment 1 were produced but providing the electrically conducting members shown in Table 2 on the outer surfaces of the outer electrode plates. The sample No. 1 was the sample of Experiment 1.

The samples were subjected to the drive testing by applying an AC voltage of 150 V having a frequency of 120 Hz thereto at room temperature. The amounts of displacement obtained at an early stage were all 40 μm (samples Nos. 1, 9 to 12). The drive testing was conducted up to $1 \times 10^9$ cycles under the same conditions, and none of the samples (Nos. 1, 9 to 12) developed abnormal condition.

Next, the drive testing was conducted under severe conditions by applying an AC voltage of 200 V having a frequency of 240 Hz at room temperature. The results were as shown in Table 2.

TABLE 2

| Sample No. | Auxiliary member | Driven at 150 V, 120 Hz | Driven at 200 V, 240 Hz |
|---|---|---|---|
| 1 | none | OK up to $1 \times 10^9$ cycles | dropped to 4/5 after $1 \times 10^8$ cycles |
| 9 | conducting sheet of Si-dispersed polyimide | OK up to $1 \times 10^9$ cycles | OK up to $1 \times 10^9$ cycles |
| 10 | conducting coil of phosphor bronze | OK up to $1 \times 10^9$ cycles | OK up to $1 \times 10^9$ cycles |
| 11 | conducting Si corrugated plate | OK up to $1 \times 10^9$ cycles | OK up to $1 \times 10^9$ cycles |
| 12 | conducting Ni fiber aggregate | OK up to $1 \times 10^9$ cycles | OK up to $1 \times 10^9$ cycles |

As will be obvious from Table 2, when the piezo-electric device (sample No. 1) produced in Experiment 1 was driven at a high speed by supplying a large current, the outer electrode plates were locally heated, some wires were broken in the outer electrode plates, and the amount of displacement has decreased.

On the other hand, when continuously driven at high speeds by supplying large currents, the samples Nos. 9 to 12 having electrically conducting members formed on the outer surfaces of the outer electrode plates all maintained a sufficiently low resistance in the outer electrode plates, did not cause local heating in the outer electrode plates or breakage in the wires to the outer electrode plates, and did not develop abnormal condition even after driven up to $1 \times 10^9$ cycles.

What is claimed is:

1. A laminated piezo-electric device comprising:
   a pole-like laminate formed by alternately laminating piezo-electric layers and electrode layers in the direction of height;
   a pair of outer electrode plates formed on the different side surfaces of said pole-like laminate, a pair of neighboring electrode layers having said piezo-electric layer sandwiched therebetween being electrically connected at their side surfaces to the outer electrode plates which are different from each other; and
   flexible protruded electrically conducting terminals on the side surfaces of said pole-like laminate on where the outer electrodes are arranged, said flexible protruded electrically conducting terminals extending along the side surfaces of the electrode layers and adapted for following the stretching and contraction of said pole-like laminate in the direction of height thereof,
   wherein the electrode layers are joined to said outer electrode plates via said protruded electrically conducting terminals,
   wherein a glass layer is formed on the side surfaces of said pole-like laminate on where the outer electrodes are arranged so as to cover the side surfaces of the piezo-electric layers, and the root portions of said protruded electrically conducting terminals are buried in said glass layer, and
   wherein said protruded electrically conducting terminals are formed by applying an electrically conducting paste containing a glass powder and an electrically conducting metal powder onto the side surfaces of the pole-like laminate, followed by heating.

2. A laminated piezo-electric device comprising:
   a pole-like laminate formed by alternately laminating piezo-electric layers and electrode layers in the direction of height;
   a pair of outer electrode plates formed on the different side surfaces of said pole-like laminate, a pair of neighboring electrode layers having said piezo-electric layer sandwiched therebetween being electrically connected at their side surfaces to the outer electrode plates which are different from each other; and
   flexible protruded electrically conducting terminals on the side surfaces of said pole-like laminate on where the outer electrodes are arranged, said flexible protruded electrically conducting terminals extending along the side surfaces of the electrode layers and adapted for following the stretching and contraction of said pole-like laminate in the direction of height thereof,
   wherein the electrode layers are joined to said outer electrode plates via said protruded electrically conducted terminals, and
   wherein the electrically conducting member for preventing local heat generation is provided on the outer surfaces of said outer electrode plates, and an electric current is supplied to the outer electrode plates through said electrically conducting member.

3. A laminating piezo-electric device according to claim 2, wherein said protruded electrically conducting terminals have a thickness B of not smaller than 1 μm but larger than one-half the thickness of the piezo-electric layer.

4. A laminated piezo-electric device according to claim 2, wherein said protruded electrically conducting terminals have a height of protrusion beyond the side surfaces of the pole-like laminate which is not smaller than 1/20 the thickness of the piezo-electric layer.

5. A laminated piezo-electric device according to claim 2, wherein said outer electrode plates have a thickness of not larger than 50 μm.

6. A laminated piezo-electric device according to claim 2, wherein said protruded electrically conducting terminals and said outer electrode plates are formed of a conductor which contains at least silver.

7. A laminated piezo-electric device according to claim 2, wherein said electrically conducting member is at least one selected from the group consisting of an electrically conducting sheet formed of an electrically conducting adhesive composition, an electrically conducting coil, an electrically conducting corrugated plate and an electrically conducting fiber aggregate.

8. An injection device comprising a container having an injection aperture, a laminated piezo-electric device of claim 2 contained in said container, and a valve for injecting a liquid through said injection aperture being driven by said laminated piezo-electric device.

9. A laminated piezo-electric device according to claim 2, wherein a glass layer is formed on the side surfaces of said pole-like laminate on where the outer electrodes are arranged to as to cover the side surfaces of the piezo-electric layers, and the root portions of said protruded electrically conducting terminals are buried in said glass layer.

10. A laminated piezo-electric device comprising:
   a pole-like laminate formed by alternately laminating piezo-electric layers and electrode layers in the direction of height;
   a pair of outer electrode plates formed on the different side surfaces of said pole-like laminate, a pair of neighboring electrode layers having said piezo-electric layer sandwiched therebetween being electrically connected at their side surfaces to the outer electrode plates which are different from each other;
   flexible protruded electrically conducting terminals on the side surfaces of said pole-like laminate on where the outer electrodes are arranged said flexible protruded electrically conducting terminals extending along the side surfaces of the electrode layers and adapted for following the stretching and contraction of said pole-like laminate in the direction of height thereof,
   wherein the electrode layers are joined to said outer electrode plates via said protruded electrically conducting terminals,
   wherein spaces between the side surfaces of said pole-like laminate and the inner surfaces of said outer electrode plates are filled with an electrically conducting resin composition, and said outer electrode plates are provided with grooves or slits, and
   wherein a glass layer is formed on the side surfaces of said pole-like laminate on where the outer electrodes are arranged to as to cover the side surfaces of the piezo-electric layers, and the root portions of said protruded electrically conducting terminals are buried in said glass layer.

11. A laminated piezo-electric device according to claim 10, wherein said grooves or said slits extend in the transverse direction of the outer electrode plates among the neighboring protruded electrically conducting terminals.

* * * * *